United States Patent
Couderc et al.

(10) Patent No.: US 7,605,632 B2
(45) Date of Patent: Oct. 20, 2009

(54) HIGH-POWER ELECTRIC PULSE GENERATOR

(75) Inventors: Vincent Couderc, Verneuil-sur-Vienne (FR); Bertrand Vergne, Limoges (FR); Alain Barthelemy, Limoges (FR); Dominique Gontier, La Norville (FR); Patrick Brunel, Mandres-les-Roses (FR)

(73) Assignees: CNRS (Centre National de la Recherche Scientifique) (FR); Universite de Limoges (FR)

( * ) Notice: Subject to any disclaimer, the term of this patent is extended or adjusted under 35 U.S.C. 154(b) by 0 days.

(21) Appl. No.: 12/164,803

(22) Filed: Jun. 30, 2008

(65) Prior Publication Data
US 2009/0009227 A1 Jan. 8, 2009

Related U.S. Application Data

(63) Continuation of application No. PCT/FR2006/002825, filed on Dec. 21, 2006.

(30) Foreign Application Priority Data
Dec. 29, 2005 (FR) .................................. 05 54138

(51) Int. Cl.
*H03K 3/00* (2006.01)
(52) U.S. Cl. .......................... 327/291; 372/30; 375/289
(58) Field of Classification Search ................. 327/291, 327/544, 554; 372/10, 17, 30, 38.03, 38.07; 375/214, 286.289
See application file for complete search history.

(56) References Cited

U.S. PATENT DOCUMENTS

| 5,394,415 A | * | 2/1995 | Zucker et al. | 372/26 |
| 5,654,812 A | * | 8/1997 | Suzuki | 398/98 |
| 5,764,667 A | * | 6/1998 | Luque | 372/38.07 |

FOREIGN PATENT DOCUMENTS

FR 2679716 A1 1/1993

OTHER PUBLICATIONS

Danielsson B E: "HVDC valve with light-triggered thyristors" AC and DC Power Transmission, 1991., International Conference on London, UK, London, UK, IEE, UK, 1991, pp. 159-164.
Anderson N C: "Photoconductive power switches" British Aerospace Research Centre, 1992, pp. 4-1.
International Search Report, Jun. 20, 2007, 3 pages.

* cited by examiner

*Primary Examiner*—An T Luu
(74) *Attorney, Agent, or Firm*—St. Onge Steward Johnston & Reens LLC

(57) ABSTRACT

A high power electric pulse generator includes a charge storage device, a high voltage source for charging the charge storage device, a first photoconductor element connected to the reference potential and to the storage device, a second photoconductor element connected to the storage device and to a useful load, a first light source for delivering a pulse of light to the first photoconductor, a second light source for delivering a pulse of light to the second photoconductor and a synchronization device for synchronizing the emission delay between the first light source and the second light source. The first photoconductor and the second photoconductor are passive semiconductor elements with a linear regime forming photosensitive switches, with the first and second photoconductors being doped silicon photoconductors.

9 Claims, 4 Drawing Sheets

HIGH-POWER ELECTRIC PULSE GENERATOR

CROSS-REFERENCE TO RELATED APPLICATIONS

The present application is a continuation of pending International patent application PCT/FR2006/002825 filed on Dec. 21, 2006 which designates the United States and claims priority from French patent application 05/54138 filed on Dec. 29, 2005, the content of which is incorporated herein by reference.

FIELD OF THE INVENTION

The present invention relates to the field of high-power electrical pulse generators.

BACKGROUND OF THE INVENTION

The present invention relates more particularly to a high-voltage pulse generator comprising a charge storage means, a high-voltage source able to charge the said charge storage means, a first photoconductor element connected firstly to the reference of the potentials and secondly to the said storage means, a second photoconductor element connected firstly to the said storage means and secondly to a useful load, a first light source able to deliver a light pulse to the said first photoconductor, a second light source able to deliver a light pulse to the said second photoconductor, and a means of synchronising the emission delay between the first light source and the second light source.

This type of electrical pulse generator is referred to as the frozen wave type and, in a known manner, makes it possible to obtain bipolar signals or alternating polarisation pulse trains of any duration in theory.

In this type of generator, the photoconductors used are semiconductor substrates of various natures. Those most usually employed are said to be functioning in "avalanche" mode.

The drawback of these photoconductor systems working in avalanche mode is the high temporal jitter that is conventionally too great to synchronise short (subnanosecond) pulses. This temporal jitter in the starting of the two waves greatly limits the possibilities of controlling the required bipolar signal, and therefore the spectrum of the latter.

In addition avalanche mode does not make it possible to obtain reproducible pulses because of the chaotic character involved in the phenomenon, which in addition limits the service life of the photoswitches by local destruction of the substrate (the phenomenon of filamentation in the avalanche systems).

In order to obtain high-power electrical pulses of short duration, typically around one nanosecond or below, it is known how to use optoelectronic switches.

The application FR 2 679 716 describes for example a system generating a pulse comprising a DC high-voltage source, a capacitor that is charged by the source and that is intended to be connected to a load by means of an electrical connection adapted to the load, and a passive semiconductor element forming a photosensitive switch that closes when the photoconductive element receives a light pulse, and which is open in the absence of a light pulse. The closure of this switch causes the discharge of the capacitor and therefore the formation of a high-voltage pulse that supplies the load. The integration and nature of the semiconductor element then make it possible to obtain good performance for the pulse, typically a pulse whose rise (or fall) time is very short and is equal for example to less than 100 picoseconds (ps) for 2 kV.

This device does however have a certain number of drawbacks.

First of all, it will be understood that the device described in the application FR 2 679 716 makes it possible to determine whether pulses are negative or positive, according to the polarisation of the high-voltage source. This leads to a distribution of the power of the spectrum of the pulse limited to the low frequencies and does not allow control and mastery of this spectrum.

However, it is advantageous to control the profile of the electrical spectrum according to requirements.

In particular, in the field of biology, if a high voltage is applied to living cells, the application of a solely positive or solely negative voltage may cause a bursting of the cell by the creation of a force field within the cell.

It would therefore be advantageous to remedy these drawbacks by proposing an electrical pulse generator in which the pulse could be successively positive and negative over the pulse time and for which it is possible to control the spectral profile of the signal generated, while keeping a very short pulse duration, typically subnanosecond for peak to peak voltages of 3 kV or more and with low optical energies in order to be able to add together the power of several generators.

SUMMARY OF THE INVENTION

One of the aims of the present invention is therefore to permit the generation of a monocycle adjustable for time and therefore spectrally.

Another aim of the present invention is to allow great reproducibility of the source.

An other aim of the present invention is to obtain a peak to peak amplitude of several kilovolts for a subnanosecond bipolar signal duration.

Another aim of the present invention is to provide a system with a very long service life with low consumption of optical energy.

To this end, there is provided, according to the invention, a high-voltage pulse generator as mentioned above which, in addition to the characteristics already mentioned, is characterised by the fact that the said first photoconductor and the said second photoconductor are passive semiconductor elements in linear mode forming photosensitive switches, the said first and second photoconductors being passive photoconductors made from doped silicon.

The use of passive semiconductors in linear mode behaving as switches therefore makes it possible, through their reactivities to pulses emitted by the lasers, to obtain a very low temporal jitter which, in combination with the means of synchronisation between the sources, makes it possible to finely control the modulation of the spectrum of the signal delivered by the generator.

The use of liner mode also makes it possible to obtain signals of high reproducibility. And the service life of the photosensitive components is theoretically unlimited in this operating mode.

In addition, the use of a silicon diode provides a carrier recombination time that affords a minimisation of the jitter on triggering.

One drawback of linear mode is its high consumption of optical energy. This is why we propose a type of silicon photosensitive semiconductor making it possible to reduce this by a factor of 10 to 100 by virtue of an n and p doping and an arrangement of the semiconductors of the diode type.

BRIEF DESCRIPTION OF THE DRAWINGS

The invention will be understood better with the help of the description, given below for purely explanatory purposes, of an embodiment of the invention, with reference to the accompanying figures, where.

DETAILED DESCRIPTION OF THE INVENTION

Figure 1:
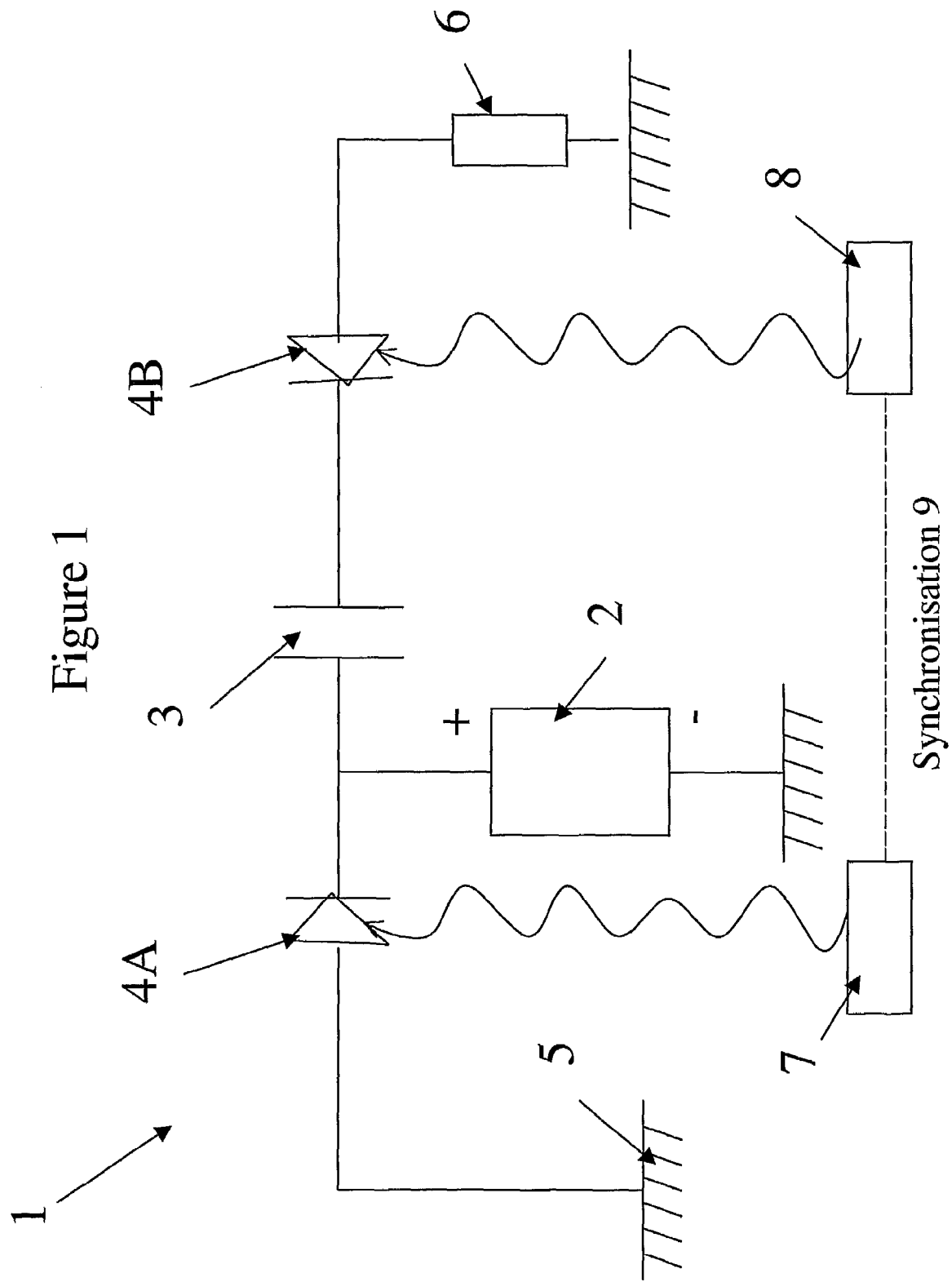
FIG. 1 illustrates a schematic diagram illustrating the high-voltage generator according to the invention.

Illustrated in FIG. 1, the generator 1 comprises a high-voltage source 2 and a microwave transmission line forming a charge storage means 3. It also comprises two semiconductors 4A and 4B on each side of the transmission line 3. The first semiconductor 4A is connected to the reference of the potentials 5 and the second semiconductor is connected to a useful load 6. The semiconductors 4A and 4B are able to be excited by two light sources 7 and 8, which are coupled by a synchronisation means 9. This synchronisation means 9 makes it possible to control the delay of the laser emissions issuing from the sources 7 and 8. The sources 7 and 8 can consist of a laser source whose radiation is split into two or by two synchronous laser sources.

When the sources 7 and 8 do not illuminate the semiconductor components 4A and 4B, the latter have a high inherent resistance of several tens of Megohms, which can be considered to be open switches. After illumination by a brief optical pulse issuing from the sources 7 and 8, the resistance of the illuminated components is substantially reduced and is close to a few ohms or even less. The switch is then closed and this closure is all the more effective since the optical energy is absorbed. This reduction in the internal resistance of the component allows the instantaneous release of the energy contained in the transmission line 3, at the reactivity speed close to the latter. The standing wave contained in the line of the generator is then released. The edges of this standing wave then propagate in the two opposite directions.

The wave front propagating directly towards the load 6 has a voltage of the same sign as that of the biasing voltage applied to the transmission line 3. The part of this wave propagating directly towards the reference of the potentials 5 will be reflected with a reversal of its biasing. A pulse of the sign opposite to that of the biasing voltage is then generated and directly follows the first pulse of the same sign as that of the biasing voltage. The combination of the two signals then forms a bipolar signal.

Figure 2:
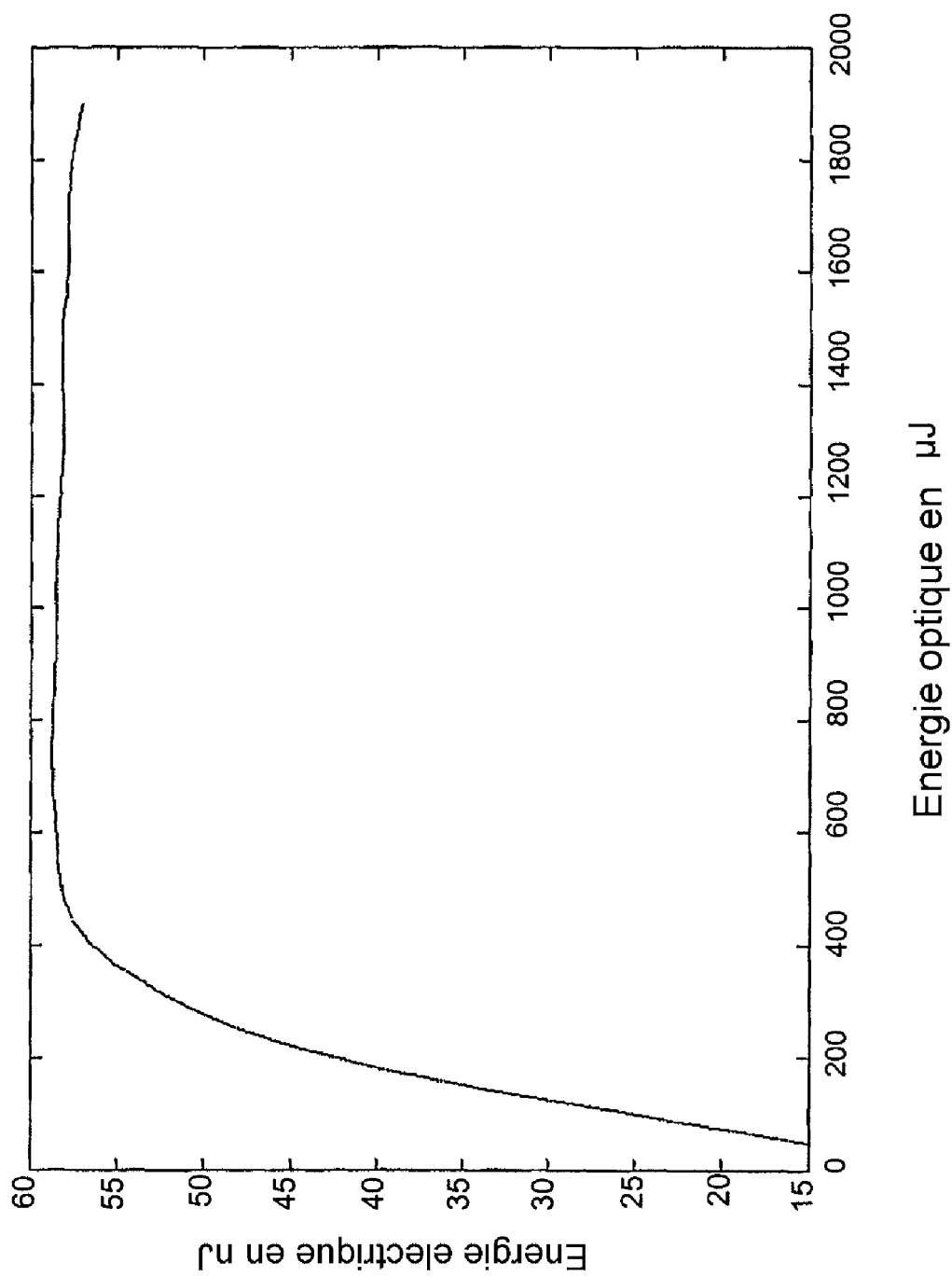
FIG. 2 illustrates the operating mode of the semiconductors according to the invention.

The characteristics of the semiconductors 4A and 4B according to the invention are now described. These semiconductors 4A and 4B are arranged so as to function in linear mode as illustrated in the linear part of FIG. 2. In this mode, the switched electrical energy depends linearly on the optical energy absorbed by the semiconductor.

The linearity of this response curve proves the linear operating mode of the photoswitches 4A and 4B, which allows synchronisation of the triggering of the two optical switches with negligible temporal jitter, typically less than 2 ps.

In addition, these n and p doped semiconductors require little optical energy when they are switched and have a long carrier recombination time compared with the duration of the signal that it is wished to generate, typically 350 nanoseconds.

An example of an n-p doped silicon semiconductor making it possible to reduce temporal jitter according to the invention is for example given in the Philips Semiconductors publication "BYX90G High-Voltage soft-recovery controlled avalanche rectifier".

Figure 3:
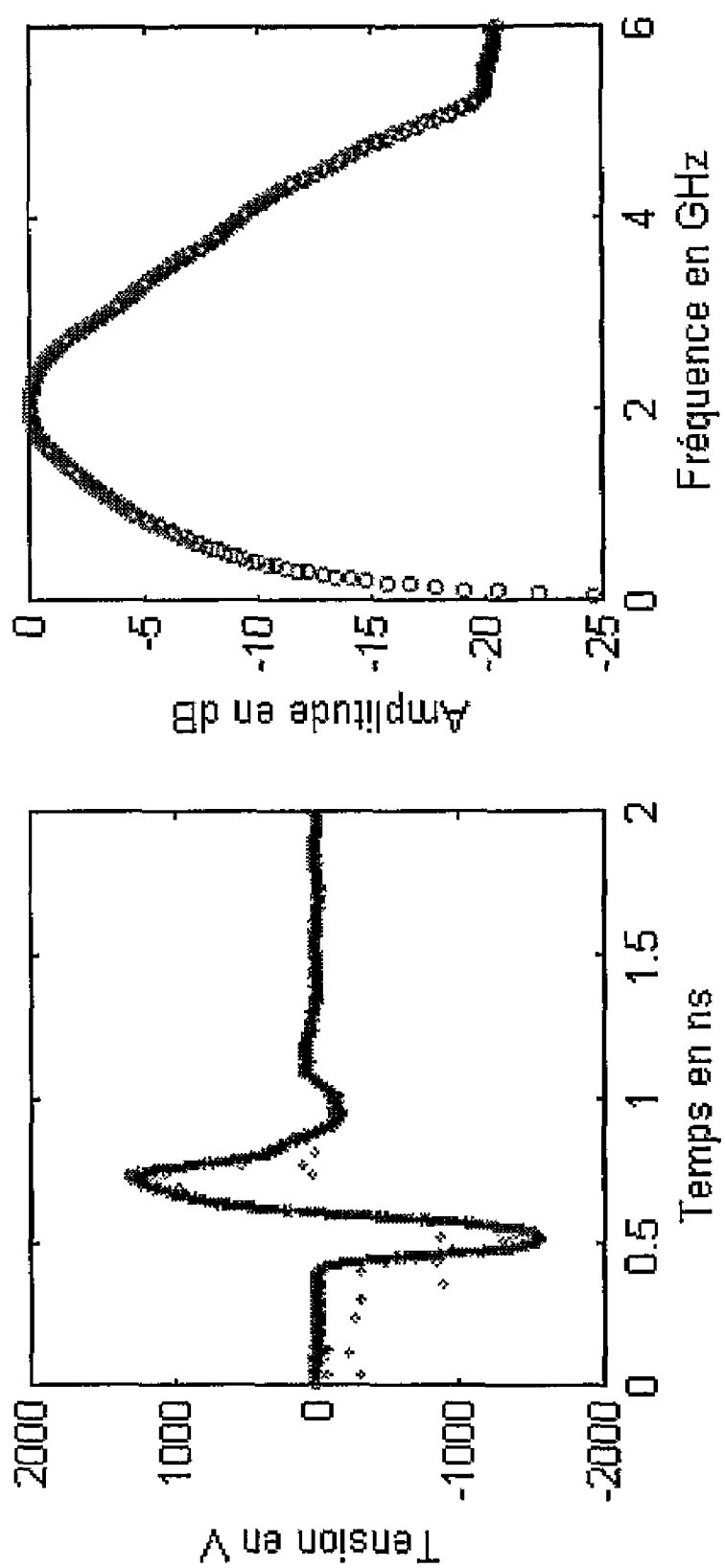
FIG. 3 illustrates a balanced monocycle obtained by a generator according to the present invention.

Illustrated in FIG. 3, the generator according to the invention therefore makes it possible to obtain a balanced monocycle, that is to say with almost zero mean value if the signals of the two light sources arrive at the same time on the two photoswitches.

The synchronisation means 9 also makes it possible to offset the closure times of the switches 4A and 4B in order to modulate the output signal.

Figure 4:
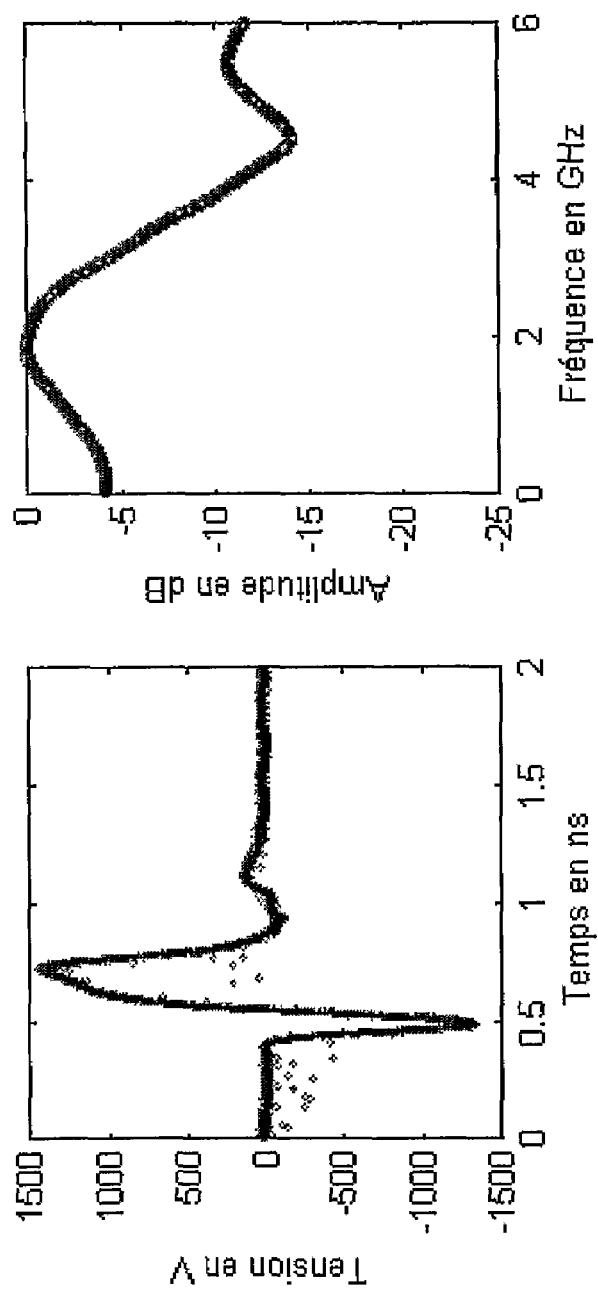
FIG. 4 illustrates an unbalanced monocycle obtained by a generator according to the present invention.

Illustrated in FIG. 4, a signal is observed on which the duration of emission of the positive signal is greater than the duration of emission of the negative signal. The associated spectrum can therefore be modulated by the synchronisation means 9.

It should be noted that, in the prior art, such a control of the bipolar signal and of the associated spectrum was impossible for signals of this power since the intrinsic temporal jitter of the avalanche mode did not allow sufficient reproducibility of the profile of the subnanosecond pulses.

Preferably the semiconductors 4A and 4B are doped differently. The doping is formed by an excess of periodic positive and negative charges of the n-p type. A single doping period then constitutes a junction of the diode type. This diode is connected in reverse compared with the biasing of the charged element 3 and therefore behaves as an open switch in the absence of light excitation.

The transmission line 3 can be of the following types: coaxial line, microribbon, microstrip or any type of microwave propagation line.

The semiconductors 4A and 4B are isolated significantly with respect to the potential by means of an insulating dielectric such as air, silicon, adhesive or teflon so as best to match the local impedance of the component to that of the transmission line 3 and to that of the output collector.

Finally, the semiconductors 4A and 4B are n-p doped so that they can withstand a biasing voltage of up to 10 kV and preferably up to 16 kV, making it possible to switch a peak voltage of more than 10 kV peak with a pulsed optical energy of around 1.5 mJ, which represents approximately 10 to 100 times the energy commonly used in linear mode for switching such voltages.

What is claimed is:

1. A high-voltage pulse generator comprising a charge storage means, a high-voltage source able to charge said charge storage means, a first photoconductor element connected firstly to the reference of the potentials and secondly to the said storage means, a second photoconductor element connected firstly to said storage means and secondly to a useful load, a first light source able to deliver a light pulse to said first photoconductor, a second light source able to deliver a light pulse to said second photoconductor, and a means of synchronising the emission delay between the first light source and the second light source, characterised in that said first photoconductor and said second photoconductor are linear-mode passive semiconductor elements forming photosensitive switches, said first and second photoconductors being photoconductors made from doped silicon.

2. A high-voltage pulse generator according to claim 1, in which said first light source and the said second light source issue from a single laser.

3. A high-voltage pulse generator according to claim 1, in which said first light source issues from a first laser and said second light source issues from a second laser.

4. A high-voltage pulse generator according to claim 1, in which said charge storage means is a transmission line.

5. A high-voltage pulse generator comprising:

a charge storage device;

a high-voltage source that charges said charge storage device;

a first photoconductor element connected between a reference potential and said storage device;

a second photoconductor element connected between said storage device and a useful load;

a first light source that delivers a light pulse to said first photoconductor;

a second light source that delivers a light pulse to said second photoconductor, wherein an emission delay between said first light source and said second light source is synchronized; and wherein said first photoconductor and said second photoconductor are linear-mode passive semiconductor elements forming photosensitive switches.

6. The high-voltage pulse generator of claim 5, wherein said first and second photoconductors comprise photoconductors made from doped silicon.

7. The high-voltage pulse generator of claim 5, wherein said first light source and said second light source issue from a single laser.

8. The high-voltage pulse generator of claim 5, wherein said first light source issues from a first laser and said second light source issues from a second laser.

9. The high-voltage pulse generator of claim 5, wherein said charge storage device is a transmission line.

\* \* \* \* \*